(12) United States Patent
Taschwer et al.

(10) Patent No.: US 12,301,188 B2
(45) Date of Patent: May 13, 2025

(54) OPERATIONAL AMPLIFIER AND METHOD FOR OPERATING AN OPERATIONAL AMPLIFIER

(71) Applicant: Hahn-Schickard-Gesellschaft fuer angewandte Forschung e.V., Villingen-Schwenningen (DE)

(72) Inventors: Armin Taschwer, Kientzheim (FR); Michael Maurer, Rheinhausen (DE); Markus Kuderer, Kirchzarten (DE)

(73) Assignee: Hahn-Schickard-Gesellschaft fuer angewandte Forschung e.V., Villingen-Schwenningen (DE)

( * ) Notice: Subject to any disclaimer, the term of this patent is extended or adjusted under 35 U.S.C. 154(b) by 484 days.

(21) Appl. No.: 17/813,485

(22) Filed: Jul. 19, 2022

(65) Prior Publication Data

US 2022/0352858 A1    Nov. 3, 2022

Related U.S. Application Data

(63) Continuation of application No. PCT/EP2021/051074, filed on Jan. 19, 2021.

(30) Foreign Application Priority Data

Jan. 20, 2020  (DE) .......................... 102020200612.1

(51) Int. Cl.
*H03F 3/45* (2006.01)
*G05F 3/26* (2006.01)
*H03F 1/30* (2006.01)

(52) U.S. Cl.
CPC ......... *H03F 3/45636* (2013.01); *G05F 3/262* (2013.01); *H03F 1/30* (2013.01);
(Continued)

(58) Field of Classification Search
CPC ..... H03F 3/45636; H03F 3/45183; H03F 1/30
See application file for complete search history.

(56) References Cited

U.S. PATENT DOCUMENTS 6,509,795 B1 *   1/2003   Ivanov ................ H03F 3/45735
                                                              330/261
6,529,070 B1 *   3/2003   Nagaraj .............. H03F 3/45659
                                                              330/253

(Continued)

OTHER PUBLICATIONS

Armin Taschner, "Robust tail current cource for OTAs with LCMFB" (presentation), Oct. 19, 2017, v2, 7 pages.

(Continued)

*Primary Examiner* — Patricia T Nguyen
(74) *Attorney, Agent, or Firm* — Perkins Coie LLP; Michael A. Glenn

(57) ABSTRACT

The present invention relates to an operational amplifier, including: a symmetrical differential amplifier; a local common mode feedback circuit coupled to the symmetrical differential amplifier; a tail current source circuit including at least one first transistor and a second transistor and a current source resistor. The tail current source circuit is configured to adjust a control voltage of the first transistor by using the second transistor such that a predetermined reference current flows through a load path of the first transistor.

12 Claims, 9 Drawing Sheets

(52) U.S. Cl.
CPC ............. *H03F 3/45183* (2013.01); *H03F 2203/45286* (2013.01); *H03F 2203/45462* (2013.01)

(56) References Cited

U.S. PATENT DOCUMENTS

| | | | |
|---|---|---|---|
| 6,690,192 | B1 | 2/2004 | Wing |
| 11,664,774 | B2 * | 5/2023 | Lin ............. H03F 3/45192 330/253 |
| 2005/0104574 | A1 | 5/2005 | Hoon et al. |
| 2006/0290418 | A1 | 12/2006 | Wong et al. |
| 2012/0153910 | A1 * | 6/2012 | Bulzacchelli ........... G05F 1/575 323/272 |
| 2018/0284832 | A1 | 10/2018 | Agarwal et al. |

OTHER PUBLICATIONS

Coban A. et al., "A 1.75 V rail-to-rail CMOS op amp", Circuits and Systems, ISCAS 1994, IEEE International Symposium on . . . , London, vol. 5, pp. 497-500, XP010143434.

Faouzi Chaahoub et al, "New CMOS Op Amp Design Dedicated for Low Supply Voltage", Solid-State Circuits Conf., 1995, IEEE, pp. 298-301, XP031679090.

Garde, M. Pilar, et al., „Super class-AB recycling folded cascode OTA, IEEE Journal of Solid-State Circuits, 2018, vol. 53., No. 9, pp. 2614-2623, XP011689336.

J. Ramirez-Angulo and M. Holmes, "Simple technique using local CMFB to enhance slew rate and bandwidth of one-stage CMOS op-amps," Electronics Letters, vol. 38, No. 23, pp. 1409-1411, Nov. 7, 2002, XP006019169.

K. Sundaresan, P. E. Allen and F. Ayazi, "Process and temperature compensation in a 7-MHz CMOS clock oscillator," in IEEE Journal of Solid-State Circuits, vol. 41, No. 2, pp. 433-442, Feb. 2006. XP055500934.

Lopez-Martin, Antonio, et al. "On the Optimal Current Followers for Wide-Swing Current-Efficient Amplifiers", IEEE International Symposium on Circuits and Systems (ISCAS) 2018. pp. 1-5.

Zhao, Xiao, et al., "Transconductance and slew rate improvement technique for current recycling folded cascode amplifier", AEU-International Journal of Electronics and Communications, 2016, vol. 70, No. 3, pp. 326-330, XP029388411.

* cited by examiner

OPERATIONAL AMPLIFIER AND METHOD FOR OPERATING AN OPERATIONAL AMPLIFIER

CROSS-REFERENCE TO RELATED APPLICATIONS

This application is a continuation of copending International Application No. PCT/EP2021/051074, filed Jan. 19, 2021, which is incorporated herein by reference in its entirety, and additionally claims priority from German Application No. 102020200612.1, filed Jan. 20, 2020, which is also incorporated herein by reference in its entirety.

The present invention relates to an operational amplifier and a method for operating an operational amplifier.

BACKGROUND OF THE INVENTION

An operational amplifier (OpAMP or OPA) or briefly amplifier is an important device in current electronic devices, by which a function of the electronic device can be ensured in a current-voltage range configured for the same.

For example, as a standard design for operational amplifiers, the usage of a so-called LCMFB (local common node feedback) circuit in symmetrical differential stages is known. The abbreviation Gm here means a current-voltage characteristic of the operational amplifier that can be represented by the equation $Gm=I_{out}/V_{in}$, wherein $I_{out}$ is an output current and $V_{in}$ is an input voltage at the operational amplifier. Here, LCMFB is used to improve the voltage-current characteristic (Gm) of the amplifier. Here, improving means reaching an improvement regarding important characteristics such as an improved gain-product-bandwidth GBW or an improved open-loop-gain OLG, at which the operator can be operated. By decoupling the output current mirror in a symmetrical amplifier with the help of an $R_{LCMFB}$ circuit, continuous transition to a two-stage amplifier concept can be obtained, depending on the size of $R_{LCMFB}$.

However, process variations of the individual components due to the incorporation of an LCMFB circuit have an influence not to be neglected. Here, process variations mean variations of the resistance of individual components of the amplifier. Variations of individual components are, for example, variations of capacitances and/or variations of threshold voltages and/or the charge carrier mobility of transistor devices. The resistors in an amplifier circuit are particularly effected by process variations. The variations at the resistors, for example, can be ±30% from wafer to wafer. These variations or process variations are mainly due to tolerances during production of the individual masks and tolerances during production of individual material layers during silicon processing. Additionally, the characteristics of all electronic devices are more or less dependent on the temperature in first and frequently also second order. The combination of process and temperature variations of all components can have the effect that up to ±50% Gm overall variations may be expected.

This means that the operational amplifier has to be over-dimensioned so that the operational amplifier shows a certain specification, i.e., reliably operates in a desired current-voltage range. This means that more power is needed. For amplifiers configured for low power, the entire Gm variations may be disadvantageous.

Normally, a current source where the current $I_{Bias}$ or $I_{Tail}$ is applied is referred to as tail of the amplifier. This tail current source is frequently given as current mirror with a current reference. The amount of the current $I_{Tail}$ defines, for example, a current-voltage characteristic $gm_{DP}$. In an operational amplifier without LCMFB circuit, the entire current-voltage characteristic Gm is given by $gm_{DP}$, wherein $gm_{DP}$ specifies a value for the current-voltage characteristic of the input transistors of the operational amplifier. The process variations in amplifiers known from conventional technology without LCMFB circuits frequently result in process and temperature variations of Gm~±15%, wherein $Gm=gm_{DP}$ applies. The process and temperature variations of Gm~±15% depend, for example, on how the respective transistor has been designed or whether the same is operated in WI (weak inversion) or SI (strong inversion). As a tendency, there are, less variations in the operating mode SI.

An amplifier with LCMFB circuits, however, comprises process and temperature variations of Gm~±50%, wherein in this case $Gm=nm_{DP}*gm_{drive}*Rlcmfb$ applies for the entire current-voltage characteristic. Here, $gm_{DP}$ is given by the current-voltage characteristic of the OPA input pair, $gm_{drive}$ is given by the current-voltage characteristic of the output transistors and $R_{LCMFB}$ indicates a used resistor of the LCMFB circuit. Consequently, three components vary in the amplifier with LCMFB circuit. The resistor $R_{LCMFB}$ is responsible for approximately half of the variations. A large part of the variations is due to the temperature behavior of the used components. For example, the resistor $R_{LCMFB}$ could be replaced by a transistor as can be inferred, for example, from the publication of J. Ramirez-Angulo and M. Holmes, ("Simple technique using local CMFB to enhance slew rate and bandwidth of one-stage CMOS op-amps," in Electronics Letters, vol. 38, no. 23, pp. 1409-1411, 7 Nov. 2002). However, reduced linearity will have to be reckoned with. Further, a transistor gate control needs additional circuits and hence additional power consumption.

The compensation of process variations in transistors is described, for example, in U.S. Pat. No. 6,690,192 B1. Also in the publication of K. Sundaresan, P. E. Allen and F. Ayazi, "Process and temperature compensation in a 7-MHz CMOS clock oscillator," in *IEEE Journal of Solid-State Circuits*, vol. 41, no. 2, pp. 433-442, February 2006, the compensation of variations of transistors is described. However, these methods are basically very expensive and need additional power, for example due to replica circuits.

SUMMARY

According to an embodiment, an operational amplifier may have: a symmetrical differential amplifier; a local common mode feedback circuit coupled to the symmetrical differential amplifier; a tail current source circuit including at least one first transistor and a second transistor and a current source resistor, wherein the tail current source circuit is configured to adjust a control voltage of the first transistor by using the second transistor such that a predetermined reference current flows through a load path of the first transistor, wherein a load path of the transistor is a path between a sink and a source of the transistor, wherein a control terminal of the second transistor is coupled to a sink terminal of the first transistor, and wherein a source terminal of the second transistor is coupled to the current source resistor, wherein the control voltage of the first transistor and a voltage applied across the current source resistor are correlated with each other; wherein a tail current of the symmetrical differential amplifier is based on a current flow through a load path of the second transistor and wherein the current flow through the load path of the second transistor is based on a current flow through the current source resistor, wherein the tail current source circuit includes a third transistor between the current source resistor and the control terminal of the first transistor, wherein a source terminal of the first transistor and one end of the current source resistor are both connected to a ground of the operational amplifier, wherein a sink terminal of the second transistor is coupled to the symmetrical differential amplifier, wherein a sink terminal of the third transistor is coupled to the control terminal of the first transistor, a source terminal of the third transistor is coupled to the current source resistor and the source terminal of the second transistor, wherein the sink terminal of the third transistor receives a current flow originating from the same source as the reference current, and the source terminal of the second transistor, and a control terminal of the third transistor is coupled to the control terminal of the first transistor to counteract, in particular to reduce, a voltage drop across the current source resistor, wherein the local common mode feedback circuit includes at least two resistors and the current source resistor is selected of a same type as the resistors of the local common mode feedback circuit, wherein of the same type means that the current source resistor has the same temperature coefficients and/or the same process variations and/or the same orientations in the geometrical configuration of the operational amplifier as the resistors of the local common mode feedback circuit.

According to another embodiment, a method for operating an operational amplifier may have the steps of: providing a symmetrical differential amplifier, a common mode feedback circuit and a tail current source circuit; coupling the local common mode feedback circuit to the symmetrical differential amplifier; coupling the tail current source circuit to the local common mode feedback circuit, wherein the tail current source circuit includes at least a first transistor and a second transistor and a current source resistor, wherein the tail current source circuit is configured to adjust a control voltage of the first transistor by using the second transistor, such that a predetermined reference current flows through a load path of the first transistor, wherein a load path of the transistor is a path between a sink and a source of the transistor, wherein a control terminal of the second transistor is coupled to a sink terminal of the first transistor, and wherein a source terminal of the second transistor is coupled to the current source resistor, wherein the control voltage of the first transistor and a voltage applied across a current source resistor are correlated with each other; wherein a tail current of the symmetrical differential amplifier is based on a current flow through a load path of the second transistor and wherein the current flow through the load path of the second transistor is based on a current flow through the current source resistor, wherein the tail current source circuit includes a third transistor between the current source resistor and the control terminal of the first transistor, wherein a source terminal of the first transistor and one end of the current source resistor are both connected to a ground of the operational amplifier, wherein a sink terminal of the second transistor is coupled to the symmetrical differential amplifier, wherein a sink terminal of the third transistor is coupled to the control terminal of the first transistor, a source terminal of the third transistor is coupled to the current source resistor and the source terminal of the second transistor, wherein the sink terminal of the third transistor receives a current flow originating from the same source as the reference current and a control terminal of the third transistor is coupled to the control terminal of the first transistor to allow reducing a voltage drop across the current source resistor, wherein the local common mode feedback circuit includes at least two resistors and the current source resistor is selected of a same type as the resistors of the local common mode feedback circuit, wherein of the same type means that the current source resistor has the same temperature coefficients and/or the same process variations and/or the same orientations in the geometrical configuration of the operational amplifier as the resistors of the local common mode feedback circuit.

As proposed, the modified operational amplifier includes a symmetrical differential amplifier, a local common mode feedback circuit (LCMFB circuit) coupled to the symmetrical differential amplifier and a tail current source circuit comprising at least one first transistor $M_{reg}$ and a second transistor $M_{casc}$ and a current source resistor $R_{tail}$. Here, the tail current source circuit is configured to adjust a control voltage of the first transistor $M_{reg}$ by using the second transistor $M_{casc}$ such that a predetermined reference current $I_{ref}$ flows through a load path of the first transistor $M_{reg}$ during operation. A control terminal of the second transistor $M_{casc}$ is coupled to a sink terminal of the first transistor $M_{reg}$. A source terminal of the second transistor $M_{casc}$ is coupled to the current source resistor $R_{tail}$. Here, a control voltage of the first transistor $M_{reg}$ and a voltage applied across the current source resistor $R_{tail}$ are correlated with each other. A tail current $I_{tail}$ of the symmetrical differential amplifier is based on a current flow through a load path, in particular, a drain-source path of the second transistor $M_{casc}$. A current flow through the load path of the second transistor $M_{casc}$ is based on a current flow through the current source resistor $R_{tail}$. As proposed, the tail current source circuit includes a third transistor M between the current source resistor $R_{tail}$ and the control terminal of the second transistor $M_{reg}$ to counteract a voltage drop across the current source resistor $R_{tail}$. Here, "to counteract a voltage drop" means that the individual components of the proposed operational amplifier are matched such that a voltage drop across the current source resistor $R_{tail}$ is reduced during operation of the operational amplifier. Thereby, temperature and/or process variations in different operating modes of the input transistors of the operational amplifier can be reduced. The input transistors (differential pair) of the operational amplifier are frequently operated in the operating modes SI (strong inversion), MI (moderate inversion), or WI (weak inversion). An essential aspect of the proposed operational amplifier can be seen in that the current source resistor $R_{tail}$ is selected such that a resistor $R_{LCMFB}$ of the local common mode feedback circuit is at least partly compensated during operation of the operational amplifier. Here, "compensating" means reducing or counteracting. The operational amplifier described herein and the associated method for operating the operational amplifier disclose an improved operational amplifier that has an improved stability regarding temperature and/or process variations during operation of the same. The resistors $R_{LCMFB}$ and $R_{tail}$ should match, i.e., the same are configured in a similar manner with respect to their design and/or orientation and/or current flow and/or proportions. These can be conditions for matching the resistors $R_{LCMFB}$ and $R_{tail}$. Matching is known to a person skilled in the art and does not need any further explanations. Here, "compensation" does not mean complete compensation. Rather, in some cases, it can mean complete compensation. In most cases, compensation means reducing or counteracting or partially compensating as has already been disclosed.

The operational amplifier described herein includes an LCMFB circuit, wherein the operational amplifier includes a regulated cascode and a cascode resistor instead of a classical current source to compensate temperature variations or process variations. Temperature variations for example, can effect a time-varying resistor. Further, a temporal variation of a component parameter can take place due to the temperature and/or by ageing. The cascode is given by an amplifier circuit having at least two, advantageously three transistors that are advantageously coupled to each other. In particular with three transistors, temperature variations can be compensated.

By means of the LCMFB circuit, the described operational amplifier is converted to an operational amplifier with almost a two-stage concept. Here, as has been described, depending on the size of the resistor $R_{LCMFB}$, decoupling may be stronger or weaker. Realizing a two-stage concept, for example, is given only with a resistor $R_{LCMFB}$ of infinite size. Again, it should be noted that the acronym "LCMFB" is an abbreviation for "local common mode feedback". By means of an LCMFB circuit, the gain-product-bandwidth and the edge steepness or slew rate SR and the open-loop-gain OLG can be improved by means of an LCMFB circuit. Electronic devices operated wirelessly or without battery frequently need a wide bandwidth GBW and/or a steep rising edge SR and/or a large OLG with power consumption that is as low as possible. Therefore, LCMFB circuits are frequently used. With the same power consumption, all parameters in connection with GM can be improved. The slew rate SR is also improved. The SR is described by a non-linearity, which is again obtained by decoupling or transition into a two-stage concept. Due to introducing this non-linearity between input voltage and output current, the concept is also referred to as "class AB" amplifier.

Frequently, an operational amplifier includes a so-called tail current source or a current mirror with a current reference. As proposed, the tail current source or the current mirror of a current reference is replaced by a regulated cascode with a cascode resistor. An important target when producing chips is, for example, to produce as many chips as possible within one specification. The smaller the variations between the components, the more chips can then be used, i.e., the so-called yield becomes greater. By means of the regulated cascode and the resistor Rail, variations in hail counteracting the variations in $R_{LCMFB}$ can be generated. Effects of process variations, i.e., component-to-component variations and temperature variations can therefore be reduced or even be eliminated. Additionally, the usage of $M_M$ allows the reduction of process and temperature variations of $M_{DP}$, for example, by variations in $I_{tail}$, wherein overall an LCMFB OPA having significantly reduced variations can be produced. Further, by the proposed operational amplifier, temperature variations, i.e., temporal variations of a component during operation of the operational amplifier can be reduced by means of the proposed circuit. In particular, by the proposed operational amplifier, variations of the resistor and/or variations of the temperature of a component can be compensated, in particular, reduced. Further, the proposed operational amplifier can be designed as low-power operational amplifier.

A control terminal of the first transistor $M_{reg}$ is coupled to a sink terminal of the third transistor $M_M$, and a source terminal of the third transistor $M_M$ is coupled to the current source resistor $R_{tail}$. A current flow through the third transistor $M_M$ is based on the same source as the reference current $I_{ref}$ and can therefore have the same variations. The current through the third transistor $M_M$ can differ from the current through the first transistor $M_{reg}$ by a maximum of one divisor K. According to the proposed teaching, the third transistor $M_M$ is suitably configured when designing the operational amplifier so that temperature and/or process variations are as low as possible during later operation of the operational amplifier. Here, the third transistor $M_M$ acts as level-shifter. The index lvl is an acronym for "level".

Further, the control voltage of the first transistor $M_{reg}$ and the voltage applied to the current source resistor $R_{tail}$ are selected in a predetermined relation to each other, such that the control voltage of the first transistor $M_{reg}$ and the voltage applied across a current source resistor $R_{tail}$ are equal, or differ by a gate-source voltage of the third transistor $M_M$.

The third transistor $M_M$ is coupled to the first transistor $M_{reg}$ and the current source resistor Red to control a voltage drop across the current source resistor $R_{tail}$ and/or to compensate temperature variation of other devices, in particular, the first transistor $M_{reg}$ of the operational amplifier. Here, "compensating" means that the individual components of the operational amplifier are connected to each other and are selected with respect to the operating parameters such that an influence of temperature and/or process variations during operation of the operating amplifier results, which is as low as possible. Thereby, operation of the operational amplifier that is as stable as possible regarding temperature and/or process variations can be provided. It is known that a current-voltage characteristic gm of the input transistors of the operational amplifier is proportional to the reciprocal of the temperature T, i.e., gm is anti-proportional to the temperature T. Therefore, during temperature variations, the current-voltage characteristic gm can also vary.

The tail current $I_{tail}$ of the symmetrical differential amplifier is determined by the current flow through the load path of the second transistor $M_{casc}$. In particular, the tail current $I_{tail}$ of the symmetrical differential amplifier is equal to the current flow through the load path of the second transistor $M_{casc}$. Therefore, the proposed wiring of the components to each other can therefore positively influence the stability with respect to temperature and/or process variations of the operational amplifier.

The operational amplifier is configured such that at least part of the current flowing through the current source resistor $R_{tail}$ flows through the load path of the third transistor $M_M$ or wherein at least the predetermined reference current $I_{ref}$ flows through the load path of the third transistor $M_M$. Configurations of the third transistor $M_M$ with respect to suitable matching with other components can have the effect that temperature and/or process variations are as low as possible during operation of the operational amplifier.

The local common mode feedback circuit comprises at least two resistors $R_{LCMFB}$. This has the advantage that a single-stage operational amplifier can be easily converted to an operational amplifier with an approximate two-stage concept by means of the LCMFB circuit. Also, the two resistors $R_{LCMFB}$ are of the same type, i.e., of the same manner. It is possible that the resistances are also equal. However, it is also possible that the resistances of the two resistors $R_{LCMFB}$ differ.

The proposed operational amplifier is configured such that the current source resistor $R_{tail}$ is selected of the same type as the resistors $R_{LCMFB}$ of the local common mode feedback circuit. Here, "of the same type" means that the current source resistor $R_{tail}$ has the same temperature coefficients and/or the same process variations and/or the same orientations in the geometrical configuration of the operational amplifier as the resistors $R_{LCMFB}$ of the local common mode feedback circuit (RLCLMFB circuit). The geometrical configuration of the resistors is also known as "matching" in the art, as has already been described.

According to an embodiment, in the proposed operational amplifier, the symmetrical differential amplifier is replaced by a normal operational amplifier. The technical effects described herein have also been found when using a normal operational amplifier. Here, reference is made to the embodiments with symmetrical differential amplifiers and the same will not be repeated in detail.

A further aspect of the proposed teachings includes a method for operating an operational amplifier, in particular an operational amplifier as just described, the method comprising:

Providing a symmetrical differential amplifier, a common mode feedback circuit (also called LCMFB circuit) and a tail current source circuit. According to the teaching proposed herein, the tail current source circuit is given by a regulated cascode, in particular, with level-shift. Further, the method includes coupling the local common mode feedback circuit (LCMFB circuit) to the symmetrical differential amplifier; and coupling the tail current source circuit to the local common mode feedback circuit (LCMFB circuit). The tail current source circuit includes at least one first transistor $M_{reg}$ and a second transistor $M_{casc}$ and a current source resistor Rad, wherein the tail current source circuit is configured to adjust a control voltage of the first transistor $M_{reg}$ by using the second transistor $M_{casc}$ such that a predetermined reference current $I_{ref}$ flows through a load path of the first transistor $M_{reg}$. For this, the resistors of the local common mode feedback circuits and the tail current source circuits can comprise respective matching. A control terminal of the second transistor $M_{casc}$ is coupled to a sink terminal of the first transistor $M_{reg}$ and a source terminal of the second transistor $M_{casc}$ is coupled to the current source resistor $R_{tail}$. The control voltage of the first transistor $M_{reg}$ and a voltage applied across the current source resistor $R_{tail}$ are correlated with each other, wherein a tail current $I_{tail}$ of the symmetrical differential amplifier is based on a current flow through a load path or a drain-source path of the second transistor $M_{casc}$; and wherein the current flow through the load path of the second transistor $M_{casc}$ is based on a current flow through the current source resistor $R_{tail}$. Further, the tail current source circuit includes a third transistor Mini between the current source resistor $R_{tail}$ and the control terminal of the first transistor $M_{reg}$, wherein the method comprises: reducing a voltage drop across the current source resistor $R_{tail}$. Due to the fact that improved matching of the components regarding each other is selected, in particular, of the current source resistor $R_{tail}$ and the resistor $R_{LCMFB}$ of the local common mode feedback circuit, and a third transistor $M_M$ is included in the proposed circuit, during operation of the proposed operational amplifier, this can have the effect that temperature and/or process variations are compensated, in particular reduced or limited. Here, reference is made to the description of the operational amplifier and its advantages. Accordingly, this description can be applied to the method disclosed herein, and is not repeated again in detail with reference to the method.

In the proposed method, an operating point of the third transistor $M_M$ is selected such that a temperature dependency of the current source resistor $R_{tail}$ is compensated during operation of the operational amplifier. A current flowing through the third transistor $M_M$ originates from the same current source as the reference current $I_{ref}$, whereby the same variations can occur in both currents. The current flowing through the third transistor $M_M$ can differ from the current flowing through the first transistor $M_{reg}$ by a divisor K. A configuration of the third transistor $M_M$ can take place during configuration of the proposed operational amplifier such that the third transistor $M_M$ and the first transistor $M_{reg}$ have the same temperature and/or process variations. The first transistor $M_{reg}$ is operated in the SI mode (SI for strong inversion). In the SI mode, variations are reduced. As the first transistor $M_{reg}$ can amplify variations of differential transistor $M_{dp}$, the SI mode is selected. Thereby, variations can be kept as low as possible. In a symmetrical operational amplifier OPA, for example, the resistor $R_{tail}$ is introduced to compensate temperature and process variations of the resistor $R_{LCMFB}$. Further, for example, the transistor $M_M$ is introduced to compensate the transistors $M_{reg}$ and $M_{dp}$ and/or to keep the voltage drop across $R_{tail}$ low. Further, with respect to temperature variations, $R_{tail}$ can also be compensated by $M_M$. In that case, $R_{tail}$ would compensate $M_{reg}$ or $M_{dp}$ in exchange.

In the proposed method, the current flow through the devices of the tail current source circuit is regulated such that variations, in particular, temperature and/or process variations of the local common mode feedback circuits are compensated. In particular, variations of the resistors $R_{LCMFB}$ of the local common mode feedback circuit, i.e., the LCMFB circuit, can be compensated. Here, "compensating" means counteracting or reducing. Compensating does not mean herein that a variation is completely eliminated, even when this may be the case for process reasons.

The current source resistor $R_{tail}$ of the tail current source circuit is selected such that the resistors $R_{LCMFB}$ of the local common mode feedback circuit are compensated. Here, compensating means reducing or counteracting. Complete compensation can only be implemented in some cases. Rather, the variations of the resistors are reduced. This takes place with respect to temperature and process variations during operation of the operational amplifier. Here, "selected such" relates to a type and form of the resistors, but not necessarily to a resistance.

A temperature variation of the operational amplifier caused by an operating state of a transistor $M_{dp}$ is compensated, in particular reduced, by regulating an operating state of the third transistor $M_M$. An operating state of the third transistor $M_M$ in one of the operating modes WI (weak inversion) or MI (moderate inversion) can influence an operating state of the differential transistor $M_{dp}$.

With the proposed method, temperature variation and/or process variation of the operational amplifier caused by an operating state of the first transistor $M_{reg}$ is compensated by selecting the operating state the third transistor $M_M$ is operated in. In temperature variations, even overcompensation is possible due to different states of the first transistor $M_{reg}$ in the operating mode SI or the third transistor $M_M$ in the operating mode WI.

Basically, the operating states or operating modes or operating ranges of transistors described in the context of circuits described herein can be divided into three, namely WI (weak inversion), MI (moderate inversion) and SI (strong inversion). If a circuit is operated in the operating mode WI, a sub-threshold operation, the following applies for the ratio of current-voltage characteristic gm to current ID:gm/Id>10.

If a circuit is operated in the operating mode MI, a threshold operation, the following applies for the ratio of current-voltage characteristic gm to current ID:gm/Id~10.

If a circuit is operated in the operating mode SI, a super-threshold operation, the following applies for the ratio of current-voltage characteristic gm to current ID:gm/Id<10.

Generally, the ratio gm/Id indicates a measure for an effectivity of a transistor. Temperature changes or temperature variations can change the current-voltage characteristic gm of a circuit. Such a variation can heavily depend on the selected operating mode (WI, MI, or SI), in particular, in the operating mode SI there is little dependency on temperature variations while in the operating mode WI, there is large dependency between temperature change and current-voltage characteristic gm. In that case, the amount gm is proportional to the root of ID.

The proposed method is operated with an operational amplifier described herein. Therefore, the description of the individual features of the operational amplifier can be applied to a method for operating the operational amplifier and vice versa.

As described herein, the tail current source circuit comprises the third transistor $M_{Iv1}$ to control a voltage drop across the current source resistor $R_{tail}$ and/or to compensate a temperature variation of other elements of the operational amplifier. Therefore, the third transistor $M_M$ fulfills a double function.

Because the voltage drop across the current source resistor $R_{tail}$ can be controlled by the third transistor $M_M$, the current source resistor $R_{tail}$ can be shifted towards smaller resistances. Thereby, the operating range of the operational amplifier can be increased. Because temperature variations of other components of the operational amplifier can also be compensated by means of the third transistor $M_M$, the proposed operational amplifier has an improved stability with respect to possibly occurring temperature and/or process variations. In particular, temperature variations can be reduced, whereby the current-voltage characteristic gm of the input transistors of the operational amplifier varies less and can hence be improved. As already described, the current-voltage characteristic gm is proportional to the reciprocal of the temperature T. Further, the parameters GBW and OLG of the proposed operational amplifier can be improved. The gain-product-bandwidth is a characteristic of operational amplifiers. From this unified characteristic that characterizes the bandwidth at an open-loop gain of 1, the gain at specific frequencies can be calculated. The parameter OLG describes the open-loop gain at a frequency of 0 Hz.

Each of the two resistors of the LCMFB circuit or the local common mode feedback circuit is connected between the common output of the two transistors and a sink terminal of one of the two transistors. Thereby, a current flow between the sink terminal and the source terminal of the respective transistors can be influenced by a suitable selection of a resistor allocated to the respective transistor. For example, maximum current at the output of the operational amplifier converted to a two-stage operational amplifier by the LCMFB circuit can have a greater amount.

It is possible to replace the resistors of the LCMFB circuit by transistors. In that case, additional stable bias circuits are to be provided for the resistors replaced by transistors. In particular, a transistor gain control needs an additional circuit. The bias circuit would then serve to specify a minimum input voltage at the respective transistor. Even when this reduces linearity, stability regarding the temperature and/or process variations of the operational amplifier can still be improved.

In summary, an essential aspect of the present invention can be considered in that an operational amplifier and an operation of such an operational amplifier are proposed, which reduces the variations of the resistor and/or the variations of the temperature of the total operational amplifier (OPA). In particular, the proposed operational amplifier can be operated in one of the operational modes SI (strong inversion), WI (weak inversion), or MI (moderate inversion). The stability of the proposed OPA is improved. This takes place starting from a single-stage operational amplifier modified into an operational amplifier with approximately two-stage concept by means of the LCMFB circuit (common mode feedback circuit). Additionally, the current mirror of a current reference of the operational amplifier is replaced by a regulated cascode (tail current source circuit) having a cascoded resistor. Thus, the proposed operational amplifier is an improved further development of the operational amplifiers known from conventional technology whose operation shows an improved variation behavior of the operational amplifier.

It is obvious that an above-described operational amplifier can be used or is used for performing the method. Reference is also made to the above description of the operational amplifier and the same has not been completely repeated in detail in relation to the method.

BRIEF DESCRIPTION OF THE DRAWINGS

Embodiments of the present invention will be detailed subsequently referring to the appended drawings, in which.

DETAILED DESCRIPTION OF THE INVENTION

The principle of the teaching described herein will be illustrated in more detail below based on possible embodiments, wherein the detailed description of individual embodiments is no limitation of the teaching described herein.

Figure 6:
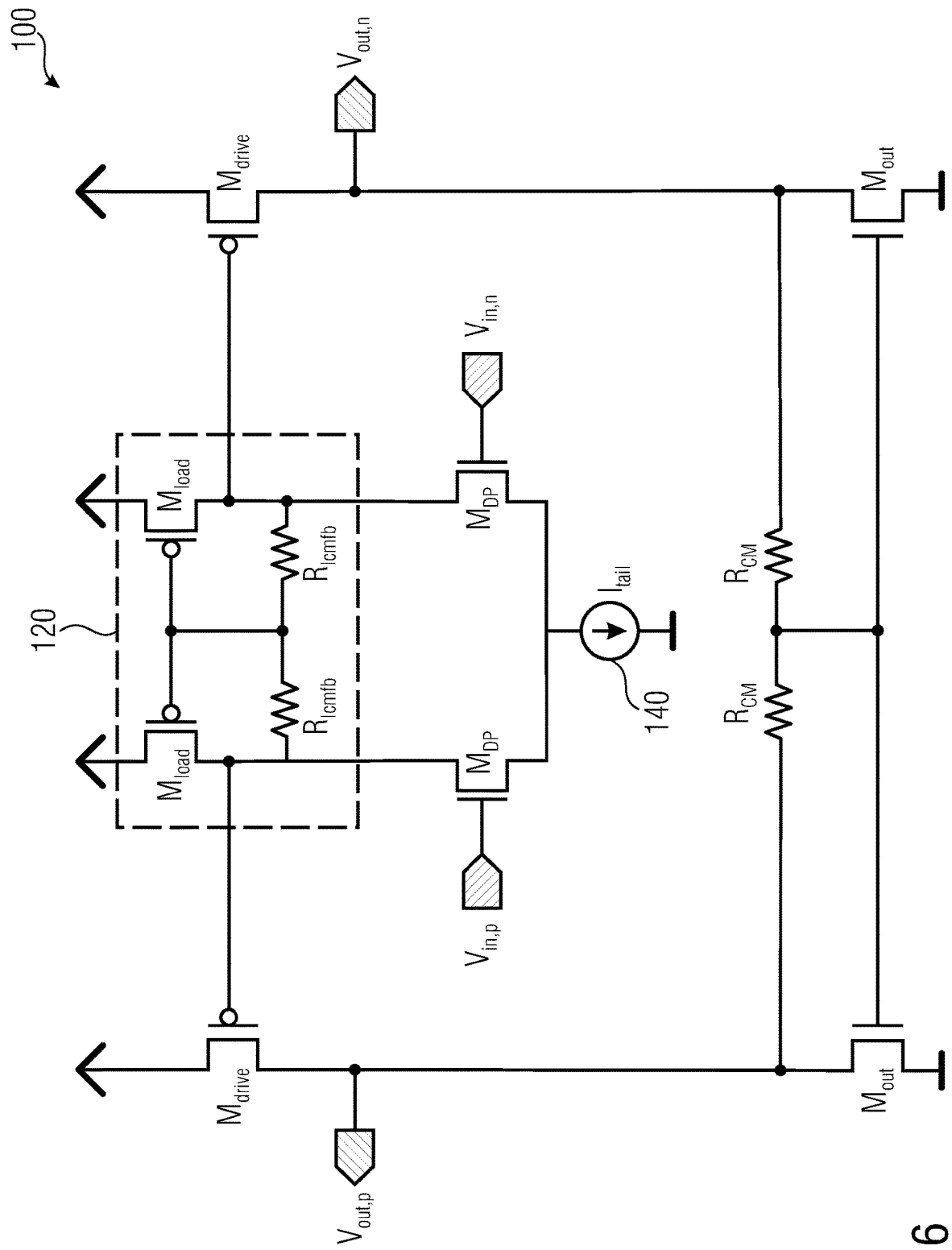
FIG. 6 is a circuit of an operational amplifier.
Figure 7:
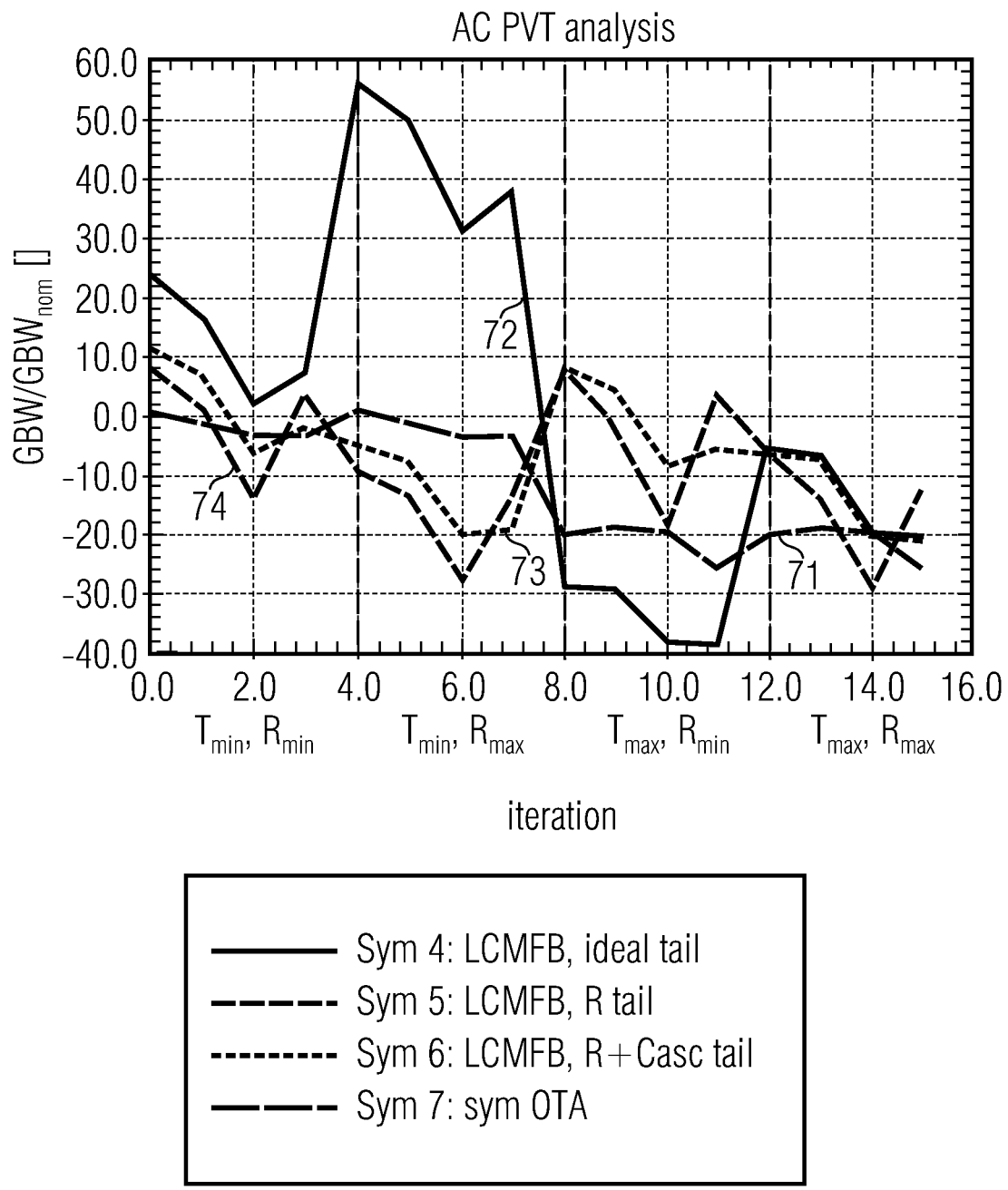
FIG. 7 is a superposition of the normalized GBW characteristics (gain-product-bandwidth=GBW) to different circuits as well as GBW characteristics of a proposed operational amplifier.
Figure 8:
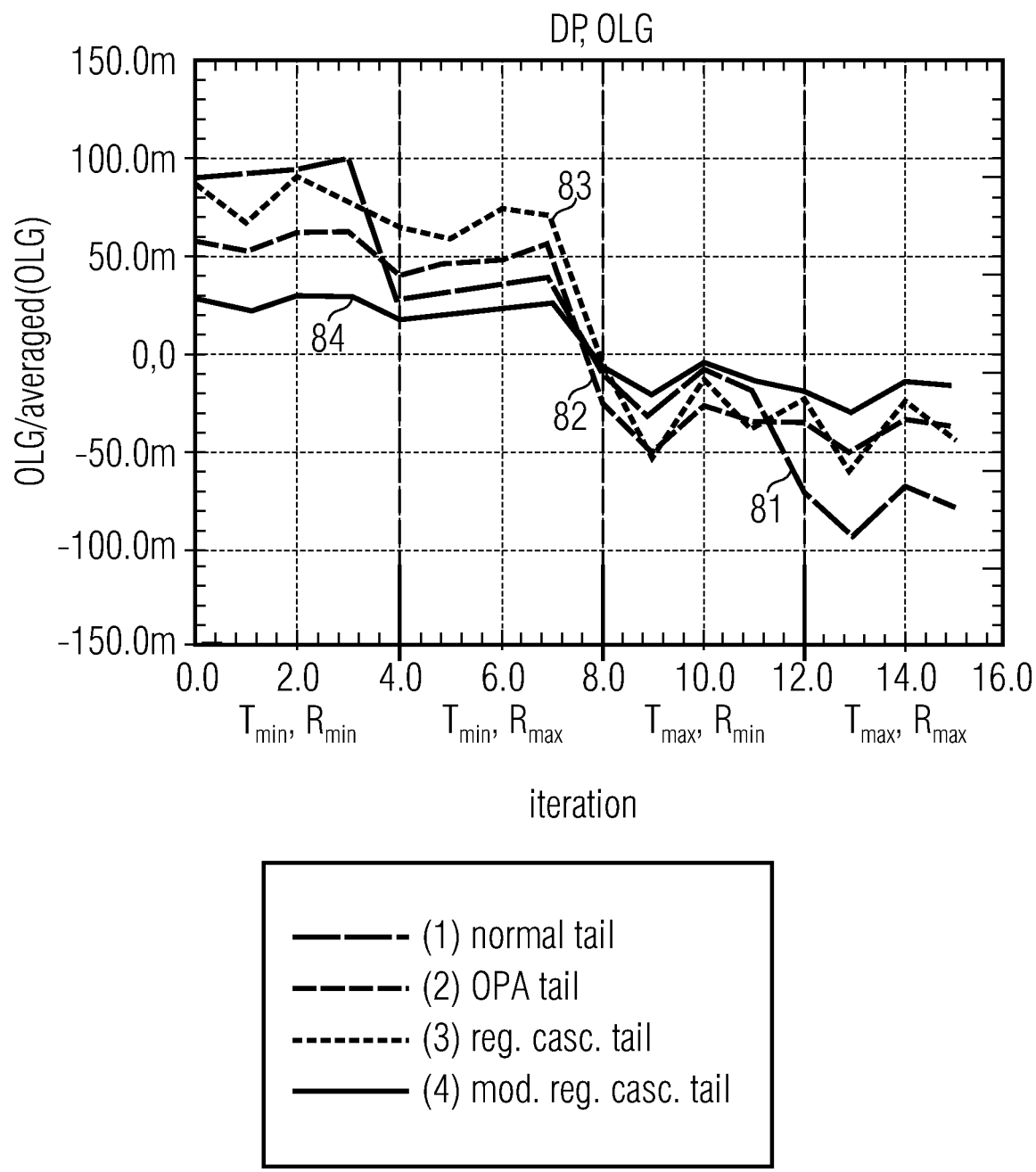
FIG. 8 is a superposition course of an ORG (open loop gain=gm*Rout) for different current source circuits and a differential pair.
Figure 9:
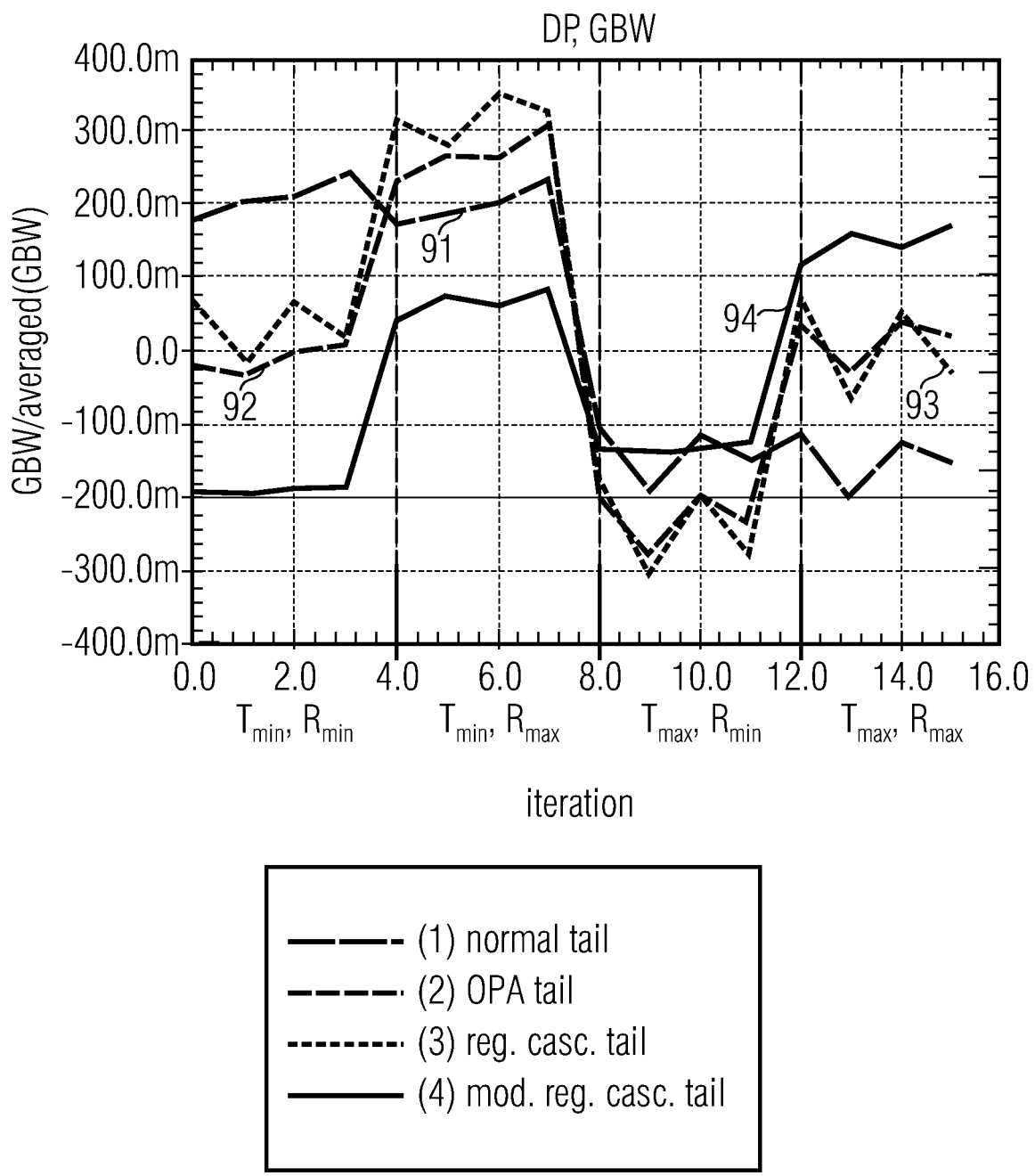
FIG. 9 is a superposition of GBW characteristics for different current source circuits and a differential pair.
Figure 10:
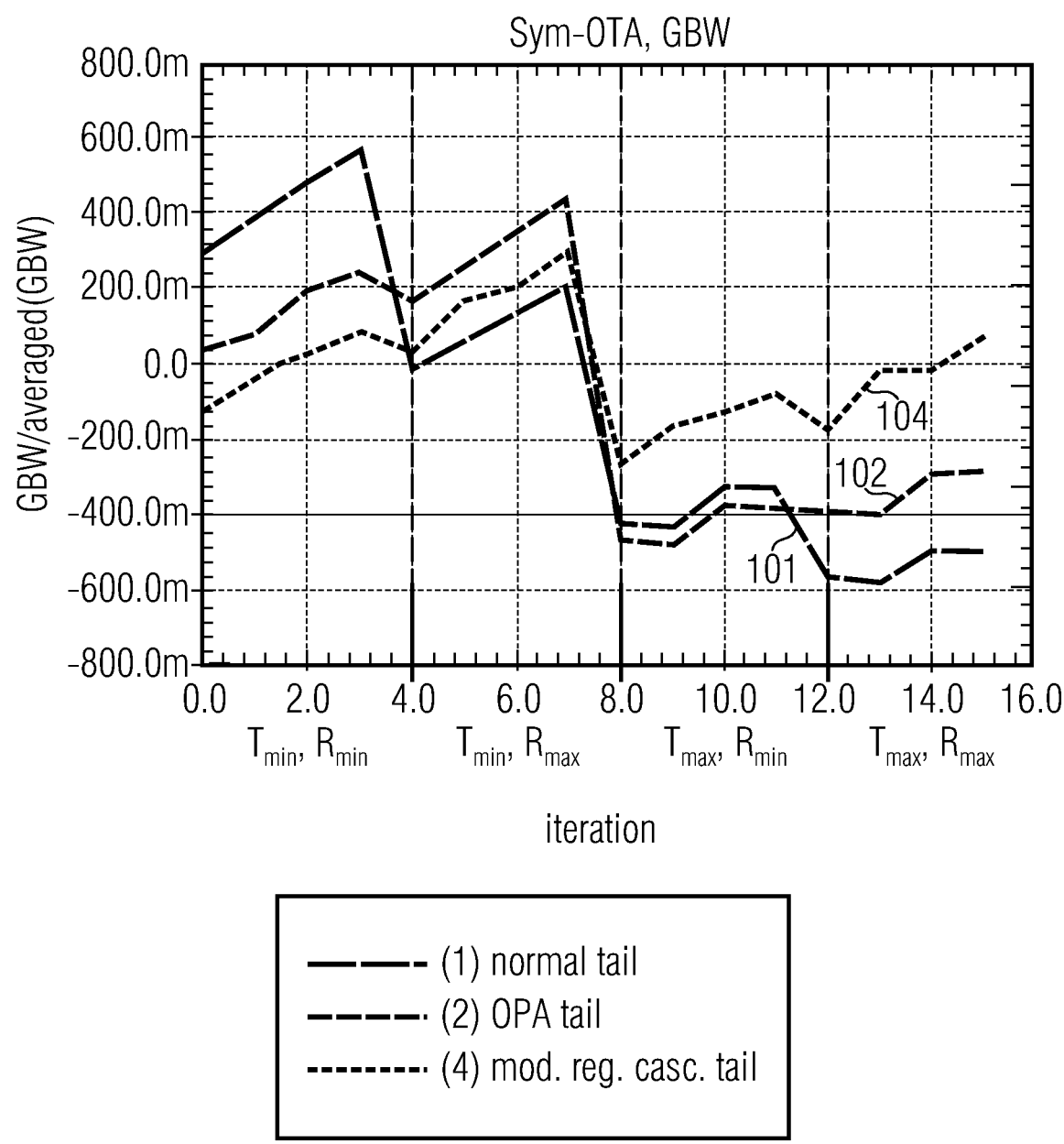
FIG. 10 is a superposition of GBW characteristics for different circuits of a symmetrical operational amplifier with different current source circuits.
Figure 11:
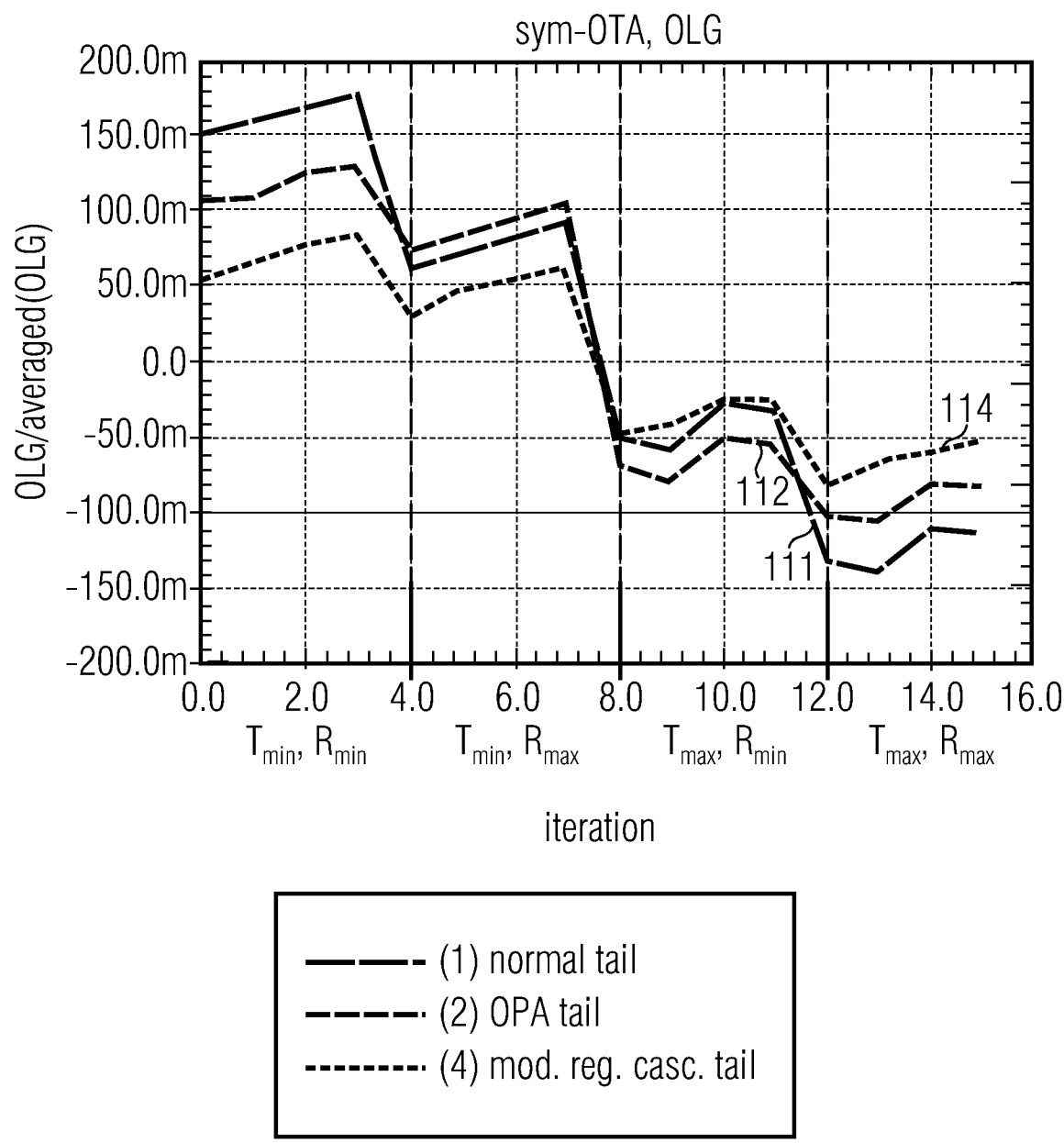
FIG. 11 is a superposed course of an OLG (open loop gain=$gm_{dp}*gm_{drive}*R_{LCMFB}*R_{out}$ for different circuits of a symmetrical operational amplifier with different current source circuits, and FIG. 12 is a method for operating a proposed operational amplifier.
Figure 12:
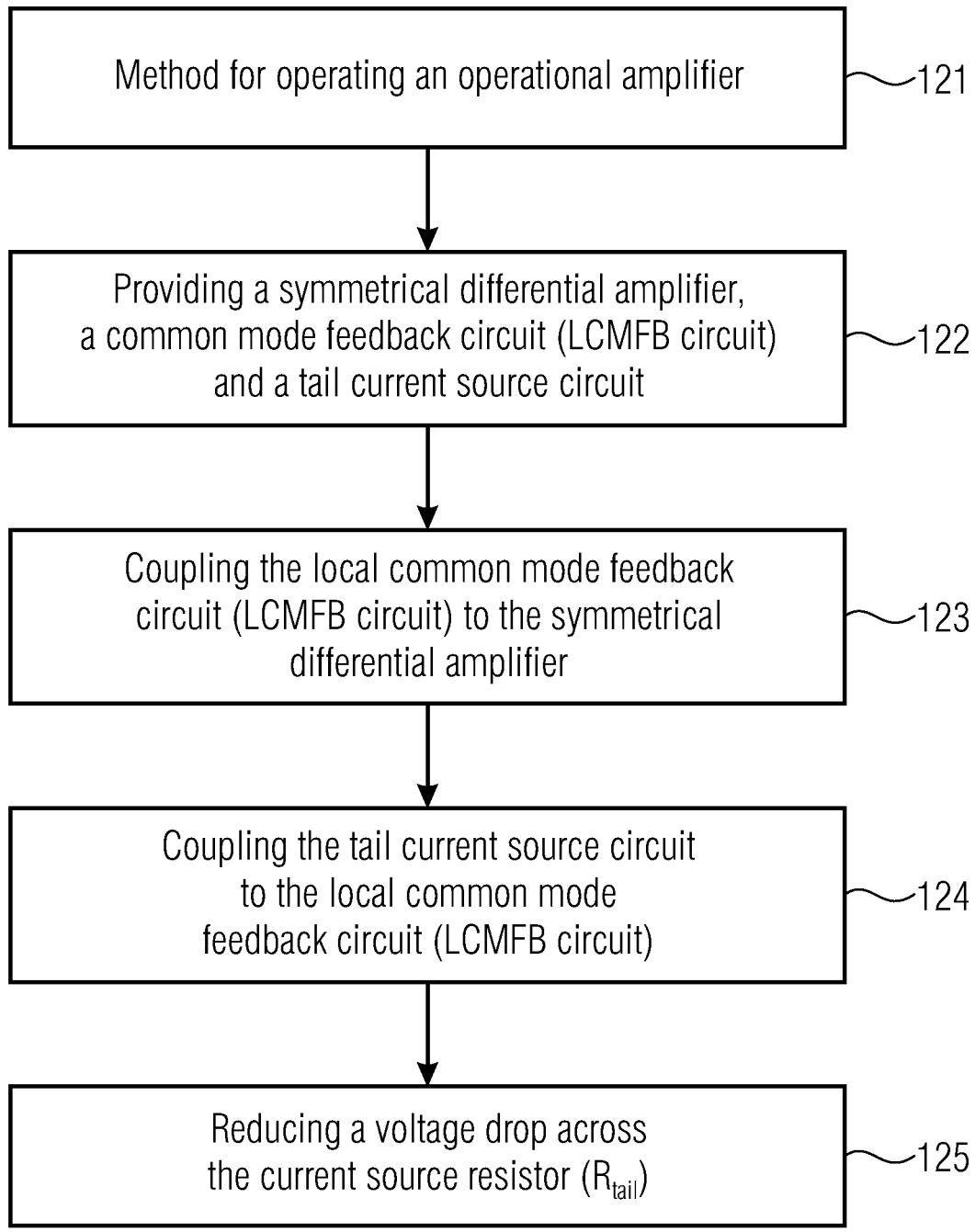

Advantages of the proposed operational amplifier will be described below together with FIGS. 1 to 12. FIGS. 1 to 3 and 5 show circuits known from conventional technology that can be applied in operational amplifiers. FIGS. 4A-B show regulated cascodes with level-shift that can be used in the proposed operational amplifier according to FIG. 6. FIG. 6 shows, in combination with FIGS. 4 and 5, possible proposed circuits of the operational amplifier and FIG. 7 shows determined GWB characteristics of the proposed operational amplifier compared to circuits for operational amplifiers known from conventional technology. FIGS. 8 and 9 show OLG and GWB characteristic curves for a differential pair, while FIGS. 10 and 11 show OLG and GWB characteristic curves for a symmetrical differential operational amplifier. In combination with FIGS. 1 to 11, the significance of the technical teaching described herein becomes obvious. FIG. 12 describes a method for operating the proposed operational amplifier.

The principle of the teaching disclosed herein is described for a symmetrical operational amplifier. However, for a person skilled in the art, it is obvious that the principles described herein can also be applied to normal operational amplifiers. By the simple usage of the circuit according to FIG. 4, for example, the variations of the OLG of the circuit of FIG. 5 can also be improved. In the parameter GBW, the variations in the normal operational amplifier do not deteriorate significantly. However, when using an OPA with LCMFB circuits, the parameters GBW, OLG, SR, etc. are extremely improved by the LCMFB circuit, such that for these amplifiers, a technical advantage results by applying the teachings descried herein.

Figure 1:
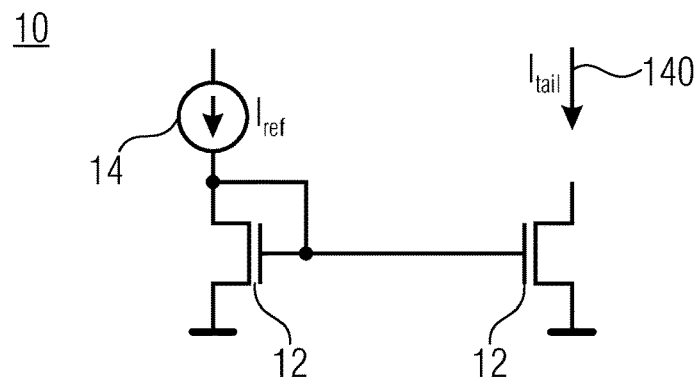
FIG. 1 is a circuit of a current source with a current mirror.

FIG. 1 shows a structure of a circuit of a current mirror 10. The current mirror 10 includes two transistors 12. The control terminals of the transistors 12 are coupled to a reference current source 14 providing a reference current $I_{ref}$. A sink terminal of one of the two transistors 12 is coupled to a tail current source wherein a tail current $I_{tail}$ and a reference current $I_{ref}$ flow through the tail current source circuit 140 according to FIG. 1.

Figure 2:
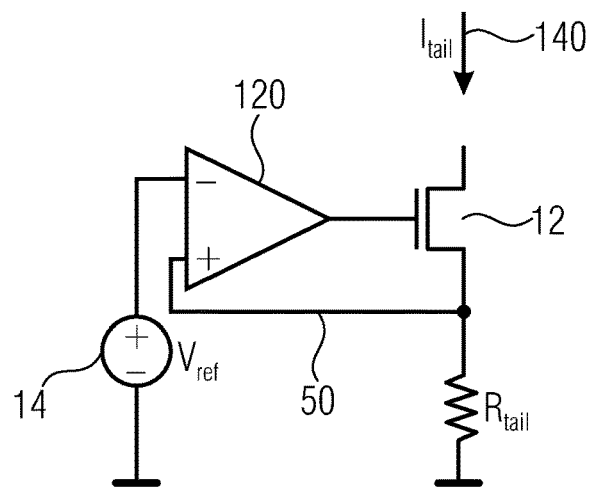
FIG. 2 is a circuit of a current source of an operational amplifier coupled to a tail resistor.

FIG. 2 shows a tail current source circuit 140 configured as symmetrical operational amplifier 120 with a reference current source 14. A reference voltage $V_{ref}$ and a reference current $I_{ref}$ are provided at the inputs of the operational amplifier 120. The circuit according to FIG. 2 comprises a tail resistor $R_{tail}$ coupled to a control loop 50. The operational amplifier 120 and a transistor 12 are coupled via the control loop 50. A source terminal of the transistor 12 is connected to an input of the operational amplifier and an output of the operational amplifier 120 is connected to a control terminal of the transistor 12. Further, the tail current source circuit 140 is connected to a source terminal of the transistor 12. Process variations of the resistor can be compensated by the circuit according to FIG. 2.

Figure 3:
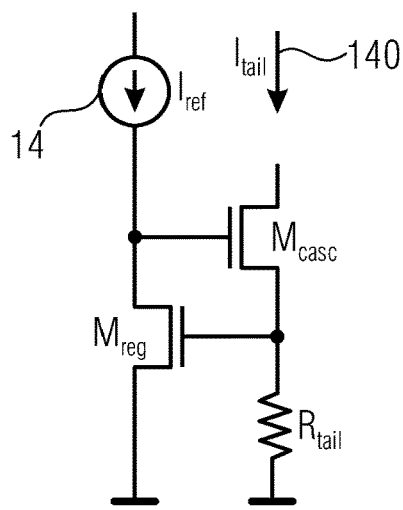
FIG. 3 is a circuit of a current source with regulated cascode.
Figure 4A:
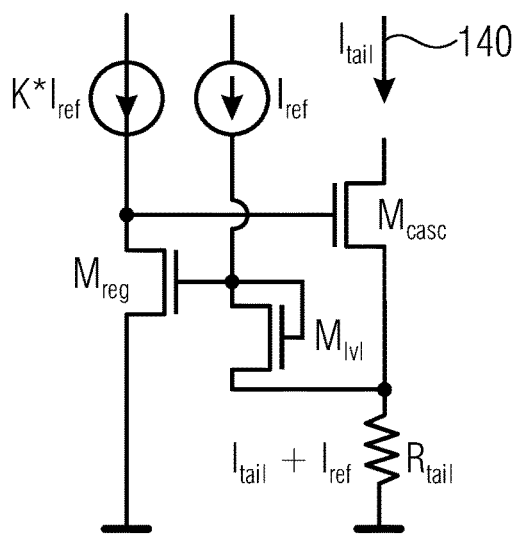
FIG. 4 is a circuit of a proposed regulated cascode to be used (tail current source circuit) with level-shift according to two variations A (FIG. 4A) and B (FIG. 4B)
Figure 4B:
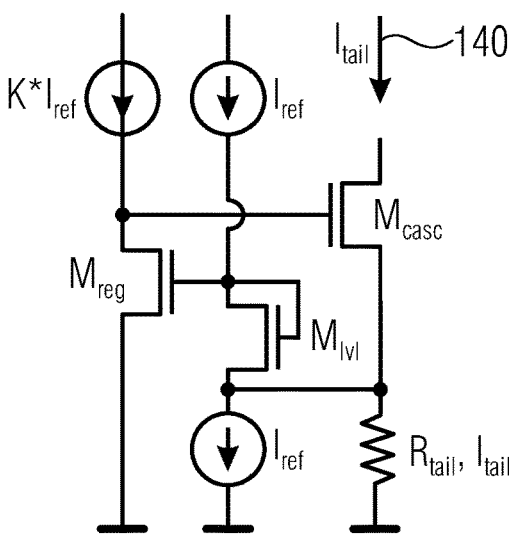

FIG. 3 shows a circuit of a tail current source circuit 140 configured as regulated cascode. The tail current source circuit 140 according to FIG. 3 comprises at least one first transistor $M_{reg}$ and a second transistor $M_{casc}$ and a current source resistor $R_{tail}$. The tail current source circuit 140 is configured to adjust a control voltage of the first transistor $M_{reg}$ by using the second transistor $M_{casc}$ such that predetermined reference current $I_{ref}$ flows through a load path of the first transistor $M_{reg}$. For this, a control terminal of the second transistor $M_{casc}$ is coupled to a sink terminal of the first transistor $M_{reg}$, and a source terminal of the second transistor $M_{casc}$ is coupled to the current source resistor $R_{tail}$. A control voltage of the first transistor $M_{reg}$ and a voltage applied across the current source resistor $R_{tail}$ are correlated with each other; wherein a tail current $I_{tail}$ of the differential amplifier is based on a current flow through a load path, for example, a drain source path of the second transistor $M_{casc}$. Current flow through the load path of the second transistor $M_{casc}$ is based on a current flow through the current source resistor $R_{tail}$.

FIGS. 4A and 4B each show an example of a tail current source circuit 140 configured as regulated cascode with level-shift. In contrary to the tail current source circuit shown in FIG. 3, the tail current source circuit of FIGS. 4A and 4B each comprise a third transistor $M_M$ between the current source resistor $R_{tail}$ and the control terminal of the first transistor $M_{reg}$. Thereby, a voltage drop across the current source resistor $R_{tail}$ can be counteracted. In particular, the voltage drop can be reduced. As indicated in FIG. 4A, a current corresponding to a sum of reference current $I_{ref}$ of a reference current source and a tail current $I_{tail}$ of a tail current source flows through the current source resistor $R_{tail}$. From FIGS. 4A and 4B, it can be seen that the sink terminal of the second transistor $M_{casc}$ is each coupled to the tail current source, such that the tail current $I_{tail}$ flows through the second transistor $M_{casc}$. Further, it can be seen from those figures that the sink terminal of the first and third transistor $M_{reg}$ and $M_M$ is each coupled to a reference current source providing a reference current $I_{ref}$ or $k*I_{ref}$, wherein k can be a real number.

FIG. 4A, B each show tail current source circuits 140 compensating the process variations at least partly, when the tail current source in a common operational amplifier is replaced by another proposed current feeding tail current source circuit 140 according to FIG. 4A, B.

Figure 5:
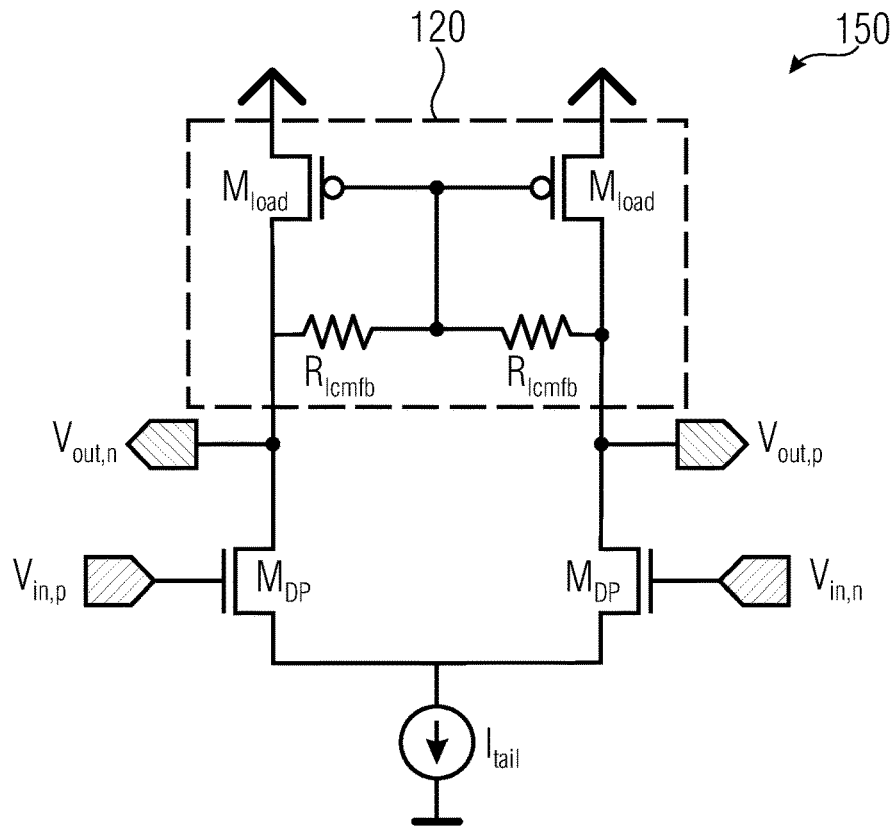
FIG. 5 is a circuit of a differential pair.

FIG. 5 shows a circuit of an operational amplifier in the form of a differential pair 150. Differential pairs are frequently dimensioned for an operating mode MI. However, a differential can be operated in so-called low power applications in the operating mode WI. The circuit according to FIG. 5 includes two differential transistors $M_{dp}$ that are coupled to one another and to a local common mode feedback circuit (LCMFB circuit) 120 as well as a tail current circuit 140. Further, the circuit according to FIG. 5 comprises two voltage inputs $V_{in, p}$ and $V_{in, n}$ as well as two voltage outputs $V_{out, n}$ and $V_{out, p}$.

FIG. 6 shows a proposed operational amplifier in the form of a symmetrical differential amplifier 100. The operational amplifier includes a local common mode feedback circuit 120 and a tail current source circuit 140. The circuit according to FIG. 6 can be considered, for example, as combination of the circuits according to FIGS. 5 and 4A or 4B, wherein the outputs $V_{in, p}$ and $V_{in, n}$ of the operational amplifier are provided at a different position. Additionally, the operational amplifier according to FIG. 6 comprises four further transistors $M_{drive}$ and $M_{out}$ as well as two further resistors $R_{CM}$. The further transistors and resistors of the operational amplifier can be the basis of occurring temperature and/or process variations which can, however, be reduced or, in the sense of the present disclosure, be compensated by means of a tail current source circuit 140 according to one of FIG. 4A or 4B in connection with the usage of a common mode feedback circuit 120. It is obvious that temperature and/or process variations of the operational amplifier can occur.

In FIGS. 7 to 11, the shown calculated GBW characteristics or OLG characteristics are each illustrated for a temperature of $T_{min}=-40°$ C. or $T_{max}=+120°$ C. and for a maximum total resistor $R_{max}$ or minimum total resistor $R_{min}$. The resistors $R_{max}$, $R_{min}$ are predetermined by the manufacturer of a chip by which the respective circuit is implemented. Further, the resistors $R_{max}$, $R_{min}$ are process-dependent values. If, for example, the process SLOW is indicated in a simulation, the resistance is set according to the specifications. The graphs in FIGS. 7 to 11 are consequently shown for the values $\{T_{min}, R_{min}\}$, $\{T_{min}, R_{max}\}$, $\{T_{max}, R_{min}\}$ and $\{T_{max}, R_{max}\}$ as outlined in the drawings. The determined GBW characteristics or OLG characteristics for the predetermined values $\{T_{min}, R_{min}\}$ are shown on the x-axis at [0.0, 4.0], for the values $\{T_{min}, R_{max}\}$ at [4.0, 8.0], for the values $\{T_{max}, R_{min}\}$ at [8.0, 12.0], and for the values $\{T_{max}, R_{max}\}$ at [12.0, 16.0] (cf. Table 1). Temperatures between the minimum temperature $T_{min}$ and the maximum temperature $T_{max}$ as well as resistors between the minimum resistor $R_{min}$ and the maximum resistor $R_{max}$ correspond to possible variations of the temperature or the resistor as they can occur during operation of an operational amplifier. Further, the signal shown in FIGS. 7 to 11 can be influenced by residual ripple caused by the transistors of the operational amplifier.

In the following table 1, the conditions under which the individual determined values as shown in FIGS. 7 to 11 have been determined are summarized. The abbreviation FF stands for fast-fast, SS for slow-slow, SF for slow-fast and FS for fast-slow. Basically, S stands for slow and F for fast.

TABLE 1

| Iteration [no.] | Resistor Operating Mode | Transistor Operating Mode | Temperature [° C.] |
|---|---|---|---|
| 0 | S | SS | −40 |
| 1 | S | SF | −40 |
| 2 | S | FS | −40 |
| 3 | S | FF | −40 |
| 4 | F | SS | −40 |
| 5 | F | SF | −40 |
| 6 | F | FS | −40 |
| 7 | F | FF | −40 |
| 8 | S | SS | 120 |
| 9 | S | SF | 120 |
| 10 | S | FS | 120 |
| 11 | S | FF | 120 |
| 12 | F | SS | 120 |
| 13 | F | SF | 120 |
| 14 | F | FS | 120 |
| 15 | F | FF | 120 |

The curve 81 shown in FIG. 7 shows the determined and normalized GBW characteristics of a symmetrical operational amplifier without LCMFB circuits (circuit not illustrated). The y-axis of FIG. 7 shows a deviation of GBW in percent from the nominal value determined at a temperature of 27° C. Curve 81 shows that the normalized GBW characteristics at $T_{min}$ move between 0 and −5, while the GBW characteristics for $T_{max}$ move between −20 and −25. The process variations in a common operational amplifier without LCMFB circuit are therefore proportional to ±15. The curve 81 has been determined without temperature influence. However, a current supply would show a temperature influence.

The curve 72 shown in FIG. 7 shows the determined and normalized GBW characteristics of an operational amplifier with LCMFB circuit as shown, for example, in FIG. 6. However, the operational amplifier does not include any tail current source circuit. It can be seen in curve 72 that the normalized GBW characteristics at $T_{min}$ move between 0 and 50, while the GBW characteristics for $T_{max}$ move between 0 and −40. The process variations in an operational amplifier with LCMFB circuits but without tail current source circuits are therefore proportional to ±50%. Therefore, the LCMFB circuit operates without compensation of process variations. In an operational amplifier 100 with LCMFB circuit 120, all components vary, wherein the resistor or the resistors $R_{LCMFB}$ of the LCMFB circuit is/are responsible for approximately half of the process variations. A large part of the process variations or the variations can be attributed to a temperature development in the operational amplifier.

The GBW characteristics 71, 72 of the operational amplifiers determined and normalized in FIG. 7 are further shown in superposition with determined and normalized GBW characteristics 73, 74 of the proposed operational amplifiers, each including an LCMFB circuit and a proposed tail current source circuit. The characteristics of the curve 71 have been acquired with a resistor $R_{LCMFB}$ equal 0 and separate gate controls of Wad, i.e., a common symmetrical amplifier as described in Sansen, 2008, "Analog design essentials" and the characteristics of the curve 72 have been acquired with a resistor $R_{LCMFB}$ unequal 0. The values in FIG. 7 by which the curves 73 and 74 have been determined show the determined and normalized GBW characteristics of an operational amplifier by using one of the circuits according to FIG. 6 with the current source circuits of FIG. 2 or 4. The curve 73 shows the GBW characteristics of an operational amplifier with LCMFB circuits wherein a current mirror of the tail current source has been replaced by a resistor $R_{tail}$ and a control loop 50 according to FIG. 2. The curve 74 shows the GBW characteristics of the proposed operational amplifier with LCMFB circuit, wherein the current mirror of the tail current source has been replaced by a regulated cascode with cascode resistor $R_{tail}$, wherein the cascode or also tail current source circuit comprises a first transistor $M_{reg}$, a second transistor $M_{casc}$ and a third transistor $M_{lvl}$.

Both curves 73 and 74 show process variations of the same order, in particular, curve 74 shows a process variation of ±18%. From the course of curve 74, it can be derived that a good compensation of the process variations can be obtained by the tail current source circuit. In particular, the tail current source circuit obtains a process variation that is almost as low as the one obtained with the control loop 50. The variations in the proposed modified operational amplifier are mainly due to the fact that the modified operational amplifier has almost two stages due to the LCMFB circuit.

FIG. 8 shows a comparison of determined courses of OLG values (Open loop gain=gm*$R_{out}$) for different current source circuits according to the circuits of one of FIGS. 1 to 4, and a differential pair according to FIG. 5. The OLG values can be determined by the relation OLG=gm*$R_{out}$, wherein gm is the already described current-voltage characteristic and $R_{out}$ describes an output resistor of the circuit. The OLG values illustrated in FIG. 8 are each averaged values that are indicated on the x-axis with respect to different temperatures and resistors as illustrated in FIG. 8 and as can be seen in Table 1. The curve 81 in FIG. 8 represents the OLG values for a differential pair according to FIG. 5 with a current mirror according to FIG. 1. The curve 82 in FIG. 8 represents the OLG values for a differential pair according to FIG. 5 with a current source according to FIG. 2. The curve 83 in FIG. 8 represents the OLG values for a differential pair according to FIG. 5 with a current source with regulated cascode according to FIG. 3. The curve 84 in FIG. 8 represents the OLG values for a differential pair according to FIG. 5 with a current source with regulated cascode with level-shift according to FIG. 4A, B. The y-axes of FIGS. 8 to 11 each show averaged OLG or averaged GBW values determined according to (OLG/OLG$_{nom}$)−1 or (GWB/GWB$_{nom}$)−1.

In the curves 82 to 84 in FIG. 8, a compensation of resistors $R_{LCMFB}$ of the local common mode feedback circuit (LCMFB circuit) can be seen. This is obvious, as the values compared to curve 91 are more on a horizontal curve than, for example, the values of curve 81. Compensation of the temperature variations of a threshold voltage of the differential pair $V_{th,dp}$ can only be partly compensated as can be seen from curves 82 and 83. However, a very good compensation of temperature variation is possible in the used circuit by which the curve 84 has been determined. This can be seen in that of the curves 81 to 84, the curve 84 is more on a horizontal curve around 0 than the curves 81 to 83. In other words, the influence of different temperatures and resistors is stable across a range between {$R_{min}$, $T_{min}$} to {$R_{max}$, $T_{max}$}. For a differential pair or a symmetrical differential amplifier according to FIG. 5, which is/are coupled to a current source circuit according to FIG. 4A, B, the temperature influence could be reduced from ±10% to ±3%.

FIG. 9 shows, for example, GBW characteristics of simple operational amplifiers OPA. The values illustrated in FIG. 9 also show that even for simple OPA, improvement can be obtained with a proposed circuit as has already been indicated at the beginning of the description of the figures in general. In detail, FIG. 9 shows a comparison of determined courses of GBW characteristics (GBW=gm/C) for different circuits of a differential pair according to FIG. 5 with different current source circuits according to FIGS. 1 to 4. The GBW values can be determined by the relation GBW=gm/C, wherein gm is the already described current-voltage characteristic and C describes a capacitance of the total circuit. The capacitance can be given, for example, by $C_{load}$=200 fF. At a value of $C_{load}$=200 fF, no variations with respect to process and temperature have been considered. Consequently, this value can be considered ideal.

The GBW values illustrated in FIG. 9 are each averaged values that are represented compared to different temperatures and resistors as illustrated on the x-axis. The curve 91 in FIG. 9 represents the GBW values for a differential pair according to FIG. 5 with a current mirror according to FIG. 1. The curve 92 in FIG. 9 represents the GBW values for a differential pair according to FIG. 5 with a current source according to FIG. 2. The curve 93 in FIG. 9 represents the GBW values for a differential pair according to FIG. 5 with a current source with regulated cascode according to FIG. 3. The curve 94 in FIG. 9 represents GBW values for a differential pair according to FIG. 5 with a current source with regulated cascode with level-shift according to FIG. 4A, B.

Of all curves represented herein, the curve 93 in FIG. 9 shows the greatest process variation. The normal regulated cascode amplifies the process variations of $M_{dp}$, which can be seen in curve 93, for example, in small spikes, i.e., the scattering of the determined values that have been combined to the curve 93. This means that the temperature variation can also be somehow amplified. In the values forming the curve 92 on the other hand, only the additional influence of $R_{tail}$ becomes obvious.

In the curves 92 to 94, the resistor $R_{tail}$ varies with the respective process and can only be compensated to a small extent. In the curve 94, however, a temperature variation can be well compensated. In other words, in sum, curve 94 shows less absolute changes than the values of curve 91. It has been found out that process and/or temperature variations considered in an absolute manner are generally lower when the differential pair according to FIG. 5 coupled to a current source circuit is operated in the operating mode SI (strong inversion) according to FIG. 4A, B. Independent of the fact what operating mode the differential pair is operated in, the ratio of the variations to each other is maintained.

FIG. 10 shows a comparison of determined courses of GBW characteristics for different circuits according to FIGS. 1, 2, and 4, and for a symmetrical operational amplifier according to FIG. 6. The GBW values can be determined by the relation GBW=$gm_{dp}$*$gm_{drive}$*$R_{LCMFB}$/C, wherein gm is the already described current-voltage characteristic of the differential pair dp or of symmetrical operational amplifiers (index "drive"), $R_{LCMFB}$ describes the resistors of the local common mode feedback circuit and C a capacitance of, for example, $C_{load}$=200 fF of the total circuit. The GBW values illustrated in FIG. 10 are each averaged values that are represented compared to different temperatures and resistors as illustrated on the x-axis. The curve 101 in FIG. 10 represents the GBW values for symmetrical operational amplifiers according to FIG. 6 with a current mirror according to FIG. 1. The curve 102 in FIG. 10 represents the GBW values for symmetrical operational amplifiers according to FIG. 6 with a current source according to FIG. 2. The curve 104 in FIG. 10 represents the GBW values for symmetrical operational amplifiers according to FIG. 6 with a current source with regulated cascode with level-shift according to FIG. 4A, B.

It can be seen from FIG. 10 that compensation of the temperature and/or process variations by a factor of 1.83 has been obtained for the curve 104, i.e., starting from ±55%, the same have been reduced to ±30% when the transistor $M_{dp}$ is operated in the WI operating mode. Even when the transistor $M_{dp}$ is operated in the SI operating mode, the ratio of compensation of the temperature and/or process variation is maintained. In detail, with reference to temperature variations, it has been determined that in the values of curve 104, the transistor $M_M$ compensates the temperature influence of $gm_{dp}$ and also partly of $gm_{drive}$, such that a temperature influence is almost completely compensated. Further, it has been determined that in the values of curves 102 to 104, the influence of the resistors $R_{LCMFB}$ is compensated by the resistors $R_{tail}$ With reference to process variation, it has been determined that in the curves 102 to 104, the resistor $R_{LCMFB}$ is compensated, in particular, slightly overcompensated. However, the influence of $gm_{drive}$ cannot be compensated in all curves 101 to 104. It has been determined that variations are generally lower when the transistors $M_{dp}$ are operated in the SI operating mode. Then, the occurring variations may be up to four times lower. The ratios, however, remain similar. In other words, an improvement can still be obtained.

FIG. 11 shows a comparison of determined curves of OLG values (Open loop gain=$gm_{dp}$*$gm_{drive}$*$R_{LCMFB}$*$R_{OUT}$) for different circuits according to FIGS. 1, 2, and 4 of a symmetrical operational amplifier according to FIG. 6. The OLG values can be determined by the relation OLG=$gm_{dp}$*$gm_{drive}$*$R_{LCMFB}$*$R_{OUT}$, wherein gm is the already described current-voltage characteristic of the differential pair dp or of the output transistor $M_{drive}$ (index "drive") and $R_{LCFMB}$ describes the resistors of the local common mode feedback circuit or $R_{out}$ is the output resistor formed by $M_{drive}$ and $M_{out}$. The OLG values illustrated in FIG. 11 are each averaged values that are represented compared to different temperatures and process states of resistors and transistors as represented in Table 1 and illustrated on the x-axis. The curve 111 in FIG. 11 represents the OLG values for a symmetrical operational amplifier according to FIG. 6 with a current mirror according to FIG. 1. The curve 112 in FIG. 11 represents the OLG values for a symmetrical operational amplifier according to FIG. 6 with the current source according to FIG. 2. The curve 114 in FIG. 11 represents the OLG values for a symmetrical operational amplifier according to FIG. 6 with a current source with regulated cascode with level-shift according to FIG. 4A, B.

The values of curve 111 show temperature and process variations of ±16%, while the values of curve 114 only show temperature and process variations of ±7%. In other words, when using a symmetrical operational amplifier according to FIG. 6 and a current source circuit according to FIG. 4A, B, the occurring variations can be improved by a factor 2.28. In detail, with reference to temperature variations, it could be determined that with a circuit generating a curve 114, the transistor $M_M$ compensates the amount $gm_{dp}$. Further, it has been determined that in curves 111 to 114 in FIG. 11, an influence of $gm_{drive}$ and $R_{cm}$ can only be compensated to a small extent. With reference to process variations, it could be determined that in circuits by which the values of curves 112 and 114 have been determined, the resistor R of the circuits has been compensated by the influence of $gm_{drive}$ has remained visible in all curves 111 to 114. Further, it has been determined that the improvement, i.e., the compensation of temperature and/or process variations is lower when the transistors $M_{dp}$ are operated in SI operating mode, but compensation still exists. Starting from variations of ±16% of the values of curve 111, in the values of curve 114, only a variation of ±11% has been determined, i.e., a compensation of the variations of ±5% could be obtained in the SI operating mode.

FIG. 12 shows schematically a method for operating the proposed operation amplifier in step 121. The method includes providing a symmetrical differential amplifier, providing a common mode feedback circuit (LCMFB circuit) and providing a tail current source circuit in step 122. Further, the method includes coupling the local common mode feedback circuit (LCMFB circuit) to the symmetrical amplifier that has been coupled to an LCMFB circuit in step 123 and coupling the tail current source circuit to the local common mode feedback circuit (LCMFB circuit) in step 124, wherein the tail current source circuit includes at least a first transistor $M_{reg}$ and a second transistor $M_{casc}$ and a current source resistor $R_{tail}$, wherein the tail current source circuit is configured to adjust a control voltage of the first transistor $M_{reg}$ by using the second transistor $M_{casc}$ such that a predetermined reference current $I_{ref}$ flows through a load path of the first transistor $M_{reg}$. A control terminal of the second transistor $M_{casc}$ is coupled to a sink terminal of the first transistor $M_{reg}$, and a source terminal of the second transistor $M_{casc}$ is coupled to the current source resistor $R_{tail}$. The control voltage of the first transistor $M_{reg}$ and a voltage applied across the current source resistor $R_{tail}$ are correlated with each other, wherein a tail current $I_{tail}$ of the symmetrical differential amplifier is based on a current flow through a load path, i.e., a drain-source path of the second transistor $M_{casc}$. The current flow through the load path of the second transistor $M_{casc}$ is based on a current flow through the current source resistor $R_{tail}$. Further, the tail current source circuit includes a third transistor M between the current source resistor $R_{tail}$ and the control terminal of the first transistor $M_{reg}$. Further, the method includes a step of reducing a voltage drop across the current source resistor $R_{tail}$ in step 125. With the method described herein, the already described compensations of the variations can be obtained. The compensations described herein can be obtained by providing the tail current source circuit described herein. The configuration of the tail current source circuit will not be described in detail again with reference to the method. Rather, reference is made to the statements with respect to the apparatus in order to avoid redundancies. In particular, reference is made to the description of the tail current source circuit.

When combining the figures, it can be summarized that process variations of the resistors $R_{LCMFB}$ can be reduced when using a current source circuit according to FIG. 2 or FIG. 3. When using a symmetrical operational amplifier according to FIG. 6 with a resistor load, temperature and process variations can be reduced. Such a symmetrical operational amplifier can be used in many operational amplifier structures with common mode feedback circuits (LCMFB circuit). For example, the teaching proposed herein can be applied in the circuits described in the publications of GARDE, M. Pilar, et al. Super class-AB recycling folded cascode OTA. IEEE Journal of Solid-State Circuits, 2018, Vol. 53, No. 9, p. 2614-2623 or of LOPEZ-MARTIN, Antonio, et al. On the Optimal Current Followers for Wide-Swing Current-Efficient Amplifiers. In: 2018 IEEE International Symposium on Circuits and Systems (ISCAS). IEEE, 2018. p. 1-5 or of ZHAO, Xiao, et al. Transconductance and slew rate improvement technique for current recycling folded cascode amplifier, AEU-International Journal of Electronics and Communications, 2016, vol. 70, No. 3, p. 326-330. In the circuits disclosed in the stated publications, adaptive biasing structures can be omitted. It is possible that a tail current source circuits functions with or without adaptive biasing structures.

Even in a common differential pair with resistor load, compensations of the occurring variations could be observed. The technical teaching proposed herein obtains the temperature and/or process variations by wiring only a few transistors. In other words, only a small effort is needed when designing the circuit of the operational amplifier to obtain a measureable compensation of variations. In particular, it could be determined that the transistor $M_M$ compensates variations of the transistors $M_{dp}$.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

In the above detailed description, different features have partly been grouped in examples to streamline the disclosure. This type of disclosure is not to be interpreted with the intent that the claimed examples comprise more features than explicitly stated in each claim. Rather, as the following claims will reflect, the subject-matter can be comprised in less than all features of an individual disclosed example. Consequently, the following claims are herewith incorporated in the detailed description, wherein each claim can be seen as its own separate example. While each claim can stand as its own individual separate example, it should be noted that although dependent claims in the claims relate to a specific combination with one or several other claims, other examples also include a combination of dependent claims with the subject-matter of each other dependent claim or a combination of each feature with other dependent or independent claims. Such combinations are included, except where it is stated that a specific combination is not intended. Further, it is intended that also a combination of features of one claim with any other independent claim is included, even when this claim is not directly dependent on the independent claim.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Operational amplifier, comprising:
a symmetrical differential amplifier;
a local common mode feedback circuit coupled to the symmetrical differential amplifier;
a tail current source circuit comprising at least one first transistor and a second transistor and a current source resistor,
wherein the tail current source circuit is configured to adjust a control voltage of the first transistor by using the second transistor such that a predetermined reference current flows through a load path of the first transistor, wherein a load path of the transistor is a path between a sink and a source of the transistor,
wherein a control terminal of the second transistor is coupled to a sink terminal of the first transistor, and wherein a source terminal of the second transistor is coupled to the current source resistor,
wherein the control voltage of the first transistor and a voltage applied across the current source resistor are correlated with each other;
wherein a tail current of the symmetrical differential amplifier is based on a current flow through a load path of the second transistor and
wherein the current flow through the load path of the second transistor is based on a current flow through the current source resistor,
wherein the tail current source circuit comprises a third transistor between the current source resistor and the control terminal of the first transistor,
wherein a source terminal of the first transistor and one end of the current source resistor are both connected to a ground of the operational amplifier, wherein a sink terminal of the second transistor is coupled to the symmetrical differential amplifier,
wherein a sink terminal of the third transistor is coupled to the control terminal of the first transistor, a source terminal of the third transistor is coupled to the current source resistor and the source terminal of the second transistor, wherein the sink terminal of the third transistor receives a current flow originating from the same source as the reference current, and the source terminal of the second transistor, and a control terminal of the third transistor is coupled to the control terminal of the first transistor to counteract, in particular to reduce, a voltage drop across the current source resistor, wherein the local common mode feedback circuit comprises at least two resistors and the current source resistor is selected of a same type as the resistors of the local common mode feedback circuit, wherein of the same type means that the current source resistor comprises the same temperature coefficients and/or the same process variations and/or the same orientations in the geometrical configuration of the operational amplifier as the resistors of the local common mode feedback circuit.

2. Operational amplifier according to claim 1, wherein the control voltage of the first transistor and the voltage applied across the current source resistor are selected in a predetermined relation to one another, such that the control voltage of the first transistor and the voltage applied across the current source resistor are equal or differ by a gate-source voltage of the third transistor.

3. Operational amplifier according to claim 1, wherein the third transistor is coupled to the first transistor and the current source resistor to control a voltage drop across the current source resistor and/or to compensate temperature variations of other devices of the operational amplifier, in particular the first transistor.

4. Operational amplifier according to claim 1, wherein the tail current of the symmetrical differential amplifier is determined by the current flow through the load path of the second transistor and is in particular equal to the same.

5. Operational amplifier according to claim 1, wherein at least part of the current flowing through the current source resistor flows through the load path of the third transistor or wherein at least the predetermined reference current flows through the load path of the third transistor.

6. Operational amplifier according to claim 1, wherein the symmetrical differential amplifier is replaced by a normal operational amplifier.

7. Method for operating an operational amplifier, in particular according to claim 1, the method comprising:
providing a symmetrical differential amplifier, a common mode feedback circuit and a tail current source circuit;
coupling the local common mode feedback circuit to the symmetrical differential amplifier;
coupling the tail current source circuit to the local common mode feedback circuit, wherein the tail current source circuit comprises at least a first transistor and a second transistor and a current source resistor, wherein the tail current source circuit is configured to adjust a control voltage of the first transistor by using the second transistor, such that a predetermined reference current flows through a load path of the first transistor, wherein a load path of the transistor is a path between a sink and a source of the transistor,
wherein a control terminal of the second transistor is coupled to a sink terminal of the first transistor, and wherein a source terminal of the second transistor is coupled to the current source resistor,
wherein the control voltage of the first transistor and a voltage applied across a current source resistor are correlated with each other;
wherein a tail current of the symmetrical differential amplifier is based on a current flow through a load path of the second transistor and
wherein the current flow through the load path of the second transistor is based on a current flow through the current source resistor,
wherein the tail current source circuit comprises a third transistor between the current source resistor and the control terminal of the first transistor,
wherein a source terminal of the first transistor and one end of the current source resistor are both connected to a ground of the operational amplifier,
wherein a sink terminal of the second transistor is coupled to the symmetrical differential amplifier,
wherein a sink terminal of the third transistor is coupled to the control terminal of the first transistor, a source terminal of the third transistor is coupled to the current source resistor and the source terminal of the second transistor, wherein the sink terminal of the third transistor receives a current flow originating from the same source as the reference current and a control terminal of the third transistor is coupled to the control terminal of the first transistor to allow reducing a voltage drop across the current source resistor
wherein the local common mode feedback circuit comprises at least two resistors and the current source resistor is selected of a same type as the resistors of the local common mode feedback circuit, wherein of the same type means that the current source resistor comprises the same temperature coefficients and/or the same process variations and/or the same orientations in the geometrical configuration of the operational amplifier as the resistors of the local common mode feedback circuit.

8. Method according to claim 7, wherein an operating point of the third transistor is selected such that a temperature dependency of the current source resistor is compensated during operation of the operational amplifier, in that a current flowing through the third transistor originates from the same current source as the reference current, wherein the same variations can occur in both currents.

9. Method according to claim 7, wherein the current flow through the devices of the tail current source circuit is regulated such that variations, in particular temperature and/or process variations of the local common mode feedback circuit are compensated, in that variations of the resistors of the local common mode feedback circuit are compensated by introducing the current source resistor.

10. Method according to claim 7, wherein a temperature variation of the operational amplifier caused by an operating state of a differential transistor allocated to the symmetrical differential amplifier is compensated by regulating an operating state of the third transistor.

11. Method according to claim 7, wherein a temperature variation and/or a process variation of the operational amplifier caused by an operating state of the first transistor is compensated by selecting the operating state in particular the third transistor is operated in.

12. Method according to claim 7, wherein an operational amplifier is operated, the operational amplifier comprising:
a symmetrical differential amplifier;
a local common mode feedback circuit coupled to the symmetrical differential amplifier;
a tail current source circuit comprising at least one first transistor and a second transistor and a current source resistor,
wherein the tail current source circuit is configured to adjust a control voltage of the first transistor by using the second transistor such that a predetermined reference current flows through a load path of the first transistor, wherein a load path of the transistor is a path between a sink and a source of the transistor,
wherein a control terminal of the second transistor is coupled to a sink terminal of the first transistor, and wherein a source terminal of the second transistor is coupled to the current source resistor,
wherein the control voltage of the first transistor and a voltage applied across the current source resistor are correlated with each other;
wherein a tail current of the symmetrical differential amplifier is based on a current flow through a load path of the second transistor and
wherein the current flow through the load path of the second transistor is based on a current flow through the current source resistor,
wherein the tail current source circuit comprises a third transistor between the current source resistor and the control terminal of the first transistor,
wherein a source terminal of the first transistor and one end of the current source resistor are both connected to a ground of the operational amplifier, wherein a sink terminal of the second transistor is coupled to the symmetrical differential amplifier,
wherein a sink terminal of the third transistor is coupled to the control terminal of the first transistor, a source terminal of the third transistor is coupled to the current source resistor and the source terminal of the second transistor, wherein the sink terminal of the third transistor receives a current flow originating from the same source as the reference current, and the source terminal of the second transistor, and a control terminal of the third transistor is coupled to the control terminal of the first transistor to counteract, in particular to reduce, a voltage drop across the current source resistor, wherein the local common mode feedback circuit comprises at least two resistors and the current source resistor is selected of a same type as the resistors of the local common mode feedback circuit, wherein of the same type means that the current source resistor comprises the same temperature coefficients and/or the same process variations and/or the same orientations in the geometrical configuration of the operational amplifier as the resistors of the local common mode feedback circuit.

* * * * *